(12) United States Patent
Kasperkovitz

(10) Patent No.: US 7,069,529 B2
(45) Date of Patent: Jun. 27, 2006

(54) METHOD AND APPARATUS FOR GENERATING A SOLID STATE CIRCUIT LAYOUT WITH IN-DESIGN VARIABILITY ASSOCIATED TO THE SETTING OF ANALOG SIGNAL PROCESSING PARAMETERS, AND AN INTEGRATED CIRCUIT DESIGN AND AN INTEGRATED CIRCUIT PRODUCED BY APPLYING SUCH METHOD

(76) Inventor: Wolfdietrich Georg Kasperkovitz, Eikenlaan 4, Waalre (NL) NL-5581 HA ( * ) Notice: Subject to any disclaimer, the term of this patent is extended or adjusted under 35 U.S.C. 154(b) by 264 days.

(21) Appl. No.: 10/484,231

(22) PCT Filed: Jul. 1, 2002

(86) PCT No.: PCT/EP02/07286

§ 371 (c)(1),
(2), (4) Date: Jan. 16, 2004

(87) PCT Pub. No.: WO03/009182

PCT Pub. Date: Jan. 30, 2003

(65) Prior Publication Data

US 2004/0177329 A1    Sep. 9, 2004

(30) Foreign Application Priority Data

Jul. 19, 2001   (EP) .................... 01202754

(51) Int. Cl.
*G06F 17/50*   (2006.01)

(52) U.S. Cl. .............. 716/11; 716/4; 716/12; 716/18

(58) Field of Classification Search ............ 716/1, 716/3, 5, 17, 4, 11, 12, 18
See application file for complete search history.

(56) References Cited

U.S. PATENT DOCUMENTS 6,249,901 B1 *   6/2001   Yuan et al. .................... 716/5

FOREIGN PATENT DOCUMENTS

WO        WO 95/32478        11/1995

* cited by examiner

*Primary Examiner*—Thuan Do
(74) *Attorney, Agent, or Firm*—Robert M. McDermott, Esq.

(57) ABSTRACT

A Solid State Integrated Circuit Layout is generated by specifying an intended functionality assortment and translating the functionality assortment into various circuitry representations. The circuitry representations are converted into circuit items of an overall circuit, whilst configuring both first interfaces between interacting circuit items within the overall circuit and also second interfaces between further such circuit items and an external world in accordance with predetermined interface specifications. In particular, for a situation wherein various such circuit items represent respective analog and/or steppable values to be specified on the basis of a circuit item in question, the parameter is assigned exclusively to a single such circuit item as a building block. The building block in question gets assigned a sufficient amount of in-design resizability and/or on-chip movability in accordance with a prespecified redefinability value range for the parameter in question.

17 Claims, 12 Drawing Sheets

DAC's

| Global Structure of Programmable BB ||
|---|---|
| Part | Important Aspect |
| Active Circuit | Defines Functionality |
| | Defines together with technology the performance limits, especially with respect to RF performance and Noise |
| | High Sensitivity with respect to technology |
| | Large Design Time |
| Passive "Fixed" Parameter(s) | Define to a large extent Chip Area |
| | Programmability via Layout only |
| | Low Sensitivity with respect to technology |
| Passive Programmable Parameter(s) | Define to a large extent Chip Area |
| | Programmability via Bus |
| | Low Sensitivity with respect to technology |
| | Preference: MOS Technology |

Fig. 11

| ASiC - Global Structure |  |
|---|---|
| Three Levels with High Interaction | |
| Relational Level | |
| Characteristic Aspects | Application |
| Library of relations between performance & cost price<br><br>Rules for generation of new relations | Support of<br>- Vendor-Buyer Relation<br>- Positioning of Emerging Products<br>- Optimization of Mature Products |
| ↕ instances (quantitative examples)<br>↕ relations (qualitative) | |
| Circuit Level (Building Blocks, BB's) | |
| Characteristic Aspects | Application |
| Library of BB circuits<br><br>Rules for definition of new BB's | Support of<br>- Programmable Designs<br>- First-Time Right Designs |
| ↕ parasitic elements<br>↕ active circuit and parameters | |
| Layout Level | |
| Characteristic Aspects | Application |
| Library of programmable Layouts of BB's<br><br>Rules for definition of new programmable Layouts | Support of<br>- Flexible Layouts with respect to encapsulation<br>- Testability |

Fig. 12

METHOD AND APPARATUS FOR GENERATING A SOLID STATE CIRCUIT LAYOUT WITH IN-DESIGN VARIABILITY ASSOCIATED TO THE SETTING OF ANALOG SIGNAL PROCESSING PARAMETERS, AND AN INTEGRATED CIRCUIT DESIGN AND AN INTEGRATED CIRCUIT PRODUCED BY APPLYING SUCH METHOD

BACKGROUND OF THE INVENTION

The invention relates to a method as recited in the preamble of Claim 1. For designing a digital circuitry concept, such method has been disclosed in U.S. Pat. No. 5,005,136. Broadly similar procedures may be followed for designs that have a substantial amount of analog circuit items or parameters, such as relating to oscillators, filters, amplifiers, and other items. The present inventors have recognized that most present-day design approaches for analog circuitry will start from a rigid circuit specification as provided by an IC-manufacturer. The latter will generally optimize the design with respect to attaining a small chip area and an optimized packing density. Such approach will result however in a highly inflexible solution, that may need much additional time and effort for generating redesigns and amendments in functionality or spec. Moreover, the design will in general feature only little or no possibility for the reuse of building blocks, due to the above focusing on area minimization. The above problem is especially relevant in the initial phases of designing a mass-product, where time-to-market is extremely critical, and where frequent redesign cycles are commonplace.

Now generally, the overall functional design will comprise a multiplicity of building blocks that are often arranged in a sequential type of organization for processing the signal or signals. Furthermore, the use of retrocoupling loops is a well-known feature. The various building blocks of such design may differ in layout view size among each other by several orders of magnitude.

The problem so sketched is further aggravated in that the designing environment, especially in the initial phases thereof, often has at least three players, to wit, the IC manufacturer, the set maker and the end user, who in principle should all benefit from an optimum design process. The present invention addresses in particular the designing for mass markets. This should lead to a product that will be accepted immediately as regards its features, operativity, and price. Time-to-market should generally be minimum.

The above problem is extremely relevant for analog-oriented circuit designs, inasmuch as for various parameters, such as voltage, frequency, etcetera, it is difficult to specify an exact optimum value in advance, but only a more or less broad range of values may be indicated. This uncertainty would often apply to various different parameters simultaneously, which renders the problem still more complex, and often quite unstable as regarding policy decisions. Furthermore, the design will often be bondpad-limited, in the sense that overall circuit size is strongly dependent on the number and configuration of the bondpads, so that the merits of area minimization are limited only.

SUMMARY TO THE INVENTION

In consequence, amongst other things, it is an object of the present invention to allow that an optimization were effected in the design process that balances among the various categories of interested parties, in that the ultimate fixing of the circuit may remain relatively open until a late instant in the designing, or even still after ma d has become complete, where a particular variable remains associated to an individual building block, instead of being associated to various building blocks simultaneously. Such multiple associating would in fact often necessitate a compromise between various, and sometimes conflicting, requirements.

Now therefore, according to one of its aspects the invention is characterized according to the characterizing part of Claim 1.

The phrase resizability space defines a key element of the characterizing part, meaning an amount of design area that is assigned to a single circuit item, wherein the intended range of value variation of an analog or steppable parameter assigned to that circuit item will cause an associated greater or lesser amount of use of the design area for the building block resulting from the circuit item in question. In particular, for in the layout realizing an analog or steppable parameter value, (1) the parameter in question is assigned to a single circuit item that is to be translated into a circuit block, and (2) the circuit block in question gets enough space to allow amending the design for different values of the parameter in question. In consequence, there are two mutually opposed directions of causality:

a. the top-down design that goes from overall functionality to specific circuit blocks b. the bottom-up assignment of the area that goes from the maximum area that is necessary for realizing the circuit block (or blocks) in question to the overall dimensions of the integrated circuit.

Essentially, an analog change or value step of a parameter will cause an associated change or step in the area necessary for the associated circuit block. This differs essentially from the designing of potentiometers and the like, where the overall size of the circuit block is always fixed, but the position of the tap can be amended. Another difference of this presumably thick-film technology with the present invention is that a new round of the design would still need the same big potentiometer, so that no further decrease in size would be possible. Moreover, the principle of the present invention has a much wider applicability, as demonstrated by the various preferred embodiments discussed herein. In particular, a prominent feature of many such embodiments is the occurrence of "empty" spaces that were originally intended for a larger size of an associated circuit block than actually used for the embodiment in question. A particular aspect of the present invention is that the some circuit design quality (in terms of optimum, i.e. minimum area) may be exchanged for faster realizing the circuit design proper. Of course, in the next design round, further optimization in view of overall circuit size would be feasible.

By itself, WO 95 32478 to IMP Inc. & Hans Klein, discusses an integrated circuit with programmable analog functions & associated programming techniques. The operation is typically described on p. 4, 1.25–29, where the configuration file is loaded on the chip to selectively activate the various programmable on-chip facilities. In consequence, there is no resizability space that may be used or not, but only a maximum amount of space taken completely by the various actually present circuit elements, that in fact are on a lower organizational level than the circuit blocks of the present invention. The difference with the present invention is that we temporarily use more space to reach functionality, which space in a next design round may be diminished to get a less expensive solution. The reference is completely silent in view of such subsequent usage of superfluous space to attain a more compact embodiment of the overall circuit.

The invention also relates to an apparatus arranged for implementing a method as claimed in Claim 1, and to an integrated circuit design and an integrated circuit realized through using the above method. Generally, the designs in question will be less than optimum from a point of view of minimizing solid state area, but will instead be flexible to a degree that hitherto was considered unattainable for the high degree of VLSI complexity of those circuits. Further advantageous aspects of the invention are recited in dependent Claims.

BRIEF DESCRIPTION OF THE DRAWING

These and further aspects and advantages of the invention will be discussed more in detail hereinafter with reference to the disclosure of preferred embodiments, and in particular with reference to the appended Figures that show:

FIG. 11, the global structure of a progammable building block;

FIG. 12, the global structure of ASiC with three levels of interaction.

DETAILED DESCRIPTION OF PREFERRED EMBODIMENTS

Figure 1:
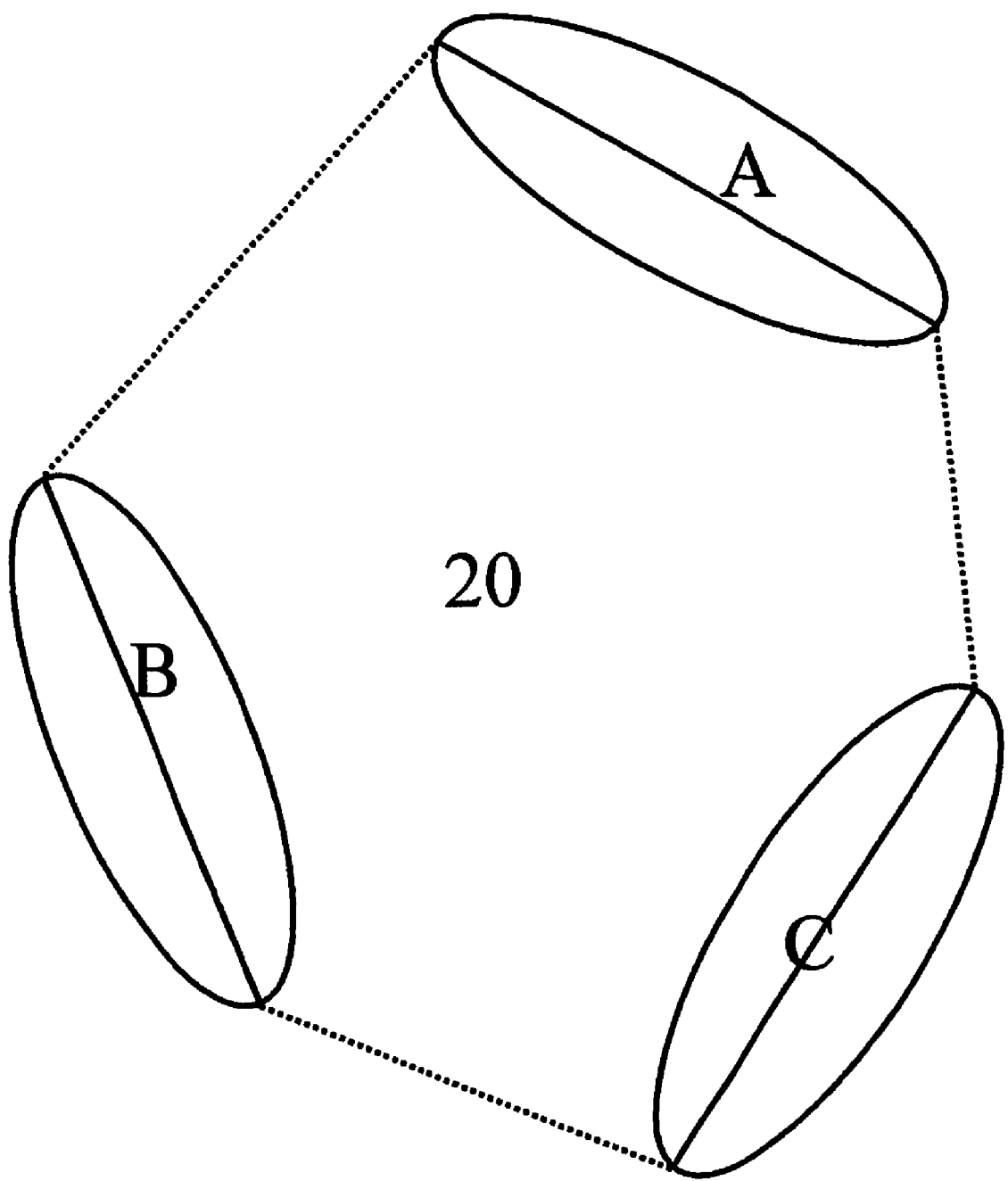
FIG. 1, a conceptual image of the interfacing between various interested parties, to wit IC-manufacture, Set-maker and End-user.

FIG. 1 shows a conceptual image of the multi-party interface between an End-user, a Set-maker, and an IC-manufacturer. The inner region 20 of the Figure illustrates the basic functionality of a particular solid state circuit product that for simplicity will not be specified further herein. The lens-shaped extremities A, B, C symbolize the problems, requirements and associated solutions facing the various interested parties. An optimum design should meet the requirements as best as possible. The situation may even be more complex, such as in the case of an OEM being present.

Now, the customer or end-user (C) will experience the following categories of problems: the circuit is too expensive, its functionality is not right, its performance insufficient, there are problems regarding final product size or weight, or there are inconveniences or expenses through incompatibility with usage in a multi-standard environment or with standards that have geographical differences.

The set-maker (B) will experience the following categories of problems: the circuit is too expensive, its functionality is not right, its performance insufficient, there are problems regarding final product size and/or weight, the design finalization is too late in view of actions by a competitor, there are complex trade-offs to be made among key parameters, such as among performance, price, power consumption and size, the product needs a costly manufacturing process through time-consuming alignments among circuit blocks, and there may be a logistic complexity through the necessity to provide special components.

The IC-manufacturer (A) will experience the following categories of problems: the product is too expensive, such as caused through special components or alignment reprocessing, the functionality not right, inter alia through insufficient programmability, insufficient performance, or over-due design finalization versus competitor's actions, complex trade-offs must be made among key parameters, such as among performance, price, power consumption and size, the product requires a costly manufacturing process through time-consuming alignments among circuit blocks, and may cause logistic complexity through the necessity for providing special components. Generally, an optimum product will be attained only through making various trade-offs.

In view of the above, the invention offers an Analog Silicon Compiler (ASiC) for fast and yet flexible prototyping of integrated circuits. Quite often, designs produced by the invention will be first-time right and will provide a high manufacturing yield through the use or reuse of proven software components or Building Blocks (BB) that have a high level of useful programmability. Such building blocks will often be programmable in two qualitatively different ways to combine fist design with maximum flexibility. The hardware programmability of the building blocks will be used to meet the fundamental analog signal processing requirements. The software programmability of the building blocks will be used to increase manufacturing yield, to integrate alignment points, and to adapt the functionality to the requirements of the end user.

A Top-Down Specification will give specification of Useful Programmability, in particular, specifying a General Structure of the ASiC and a General Structure of BB's . The problems of the Customer/End-User relate inter alia to personal taste and to a high level of customer satisfaction. The problems of the Set-Maker relate to Fast Design-in and Inexpensive Production. The Problems of the IC-Manufacturer relate to Fast. & First-Time Right Design and High Manufacturing Yield.

ASiC Deliverables are Fast & Flexible Prototype IC's , that provide Added Value for Set-Maker and End-User. In order to find the right mix of specifications in terms of functionality, features, and cost price of the total product, the set-maker requires prototype IC's with large flexibility. A similar example would be to introduce Flexibility/Personalization in the PC Industry by distinguishing a basic model and flexible add-on's like HDD, Memory, Display, and Mouse. A second example would be to introduce Flexibility/Personalization in the Personal Digital Assistant Industry by enhancing programmability through software modulesASiC Deliverables provide fast and flexible prototype IC's that give added value for both set-maker and end-User. Desirable/Useful Programmability relates to standards for use in a multi-standard environment, such as where AM inter-channel distance differs between the US and Europe. Programmability of user-interface-orientation reacts to specific situations, such as by providing gliding Stereo for FM receivers. Programmability of a new feature that is not yet fully market tested allows early market exposure for a set-maker, for attempting to raise customer satisfaction.

Figure 2:
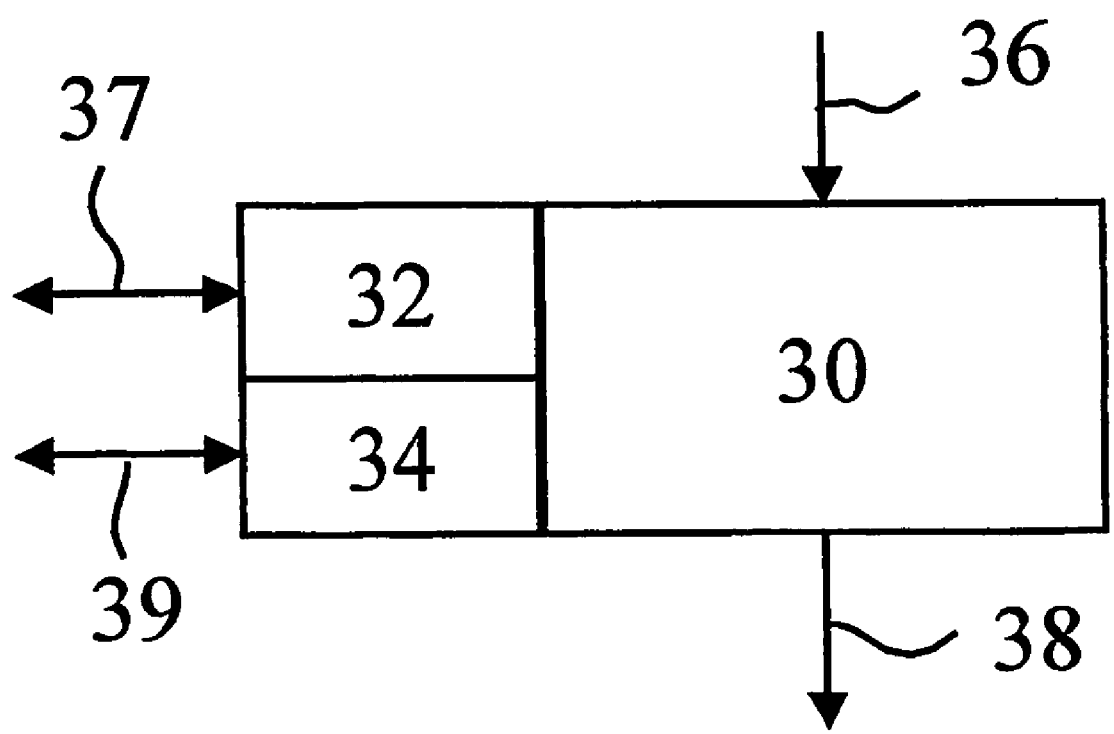
FIG. 2, a schematic of a single circuit item for use with the present invention.

ASiC deliverables provide fast and flexible prototype IC's with added value for the IC-manufacturer. In order to find the right mix of specifications, an IC-manufacturer requires prototype IC's with large flexibility regarding basic functionality, features, supply voltage, supply current, chip size, number of bonding pads, encapsulation, required external components and other. Further aspects are: Programmability of external control. Automatic Alignment for high yield and fast design-in. Programmability of new features which are not fully tested in the market giving early market exposure for an IC-manufacturer to increase the number of potential set-makers Specification of a General Structure of Building Blocks
Analog Interfaces of BB's for signal processing within complex analog architectures
Analog Interfaces of BB's for fixed or partly programmable (layout) parameter required for signal processing
Digital Interfaces of BB's (e.g. bus programmable) for Automatic Alignment, Circumstantial Control, Fit to Personal Taste etc.
Standard Analog Interfaces of BB's
Information processing signals should preferably be balanced instead of single-ended for better EMC performance
Maximum signal levels should be independent of Vcc, Temperature, manufacturing spread etc.
Control signals, such as AGC, AFC, PLL, should preferably be balanced instead of single-ended for giving better EMC performance.
Universal DC-levels should provide for fast system design (click).
Specification of General Structure of BB's
DC Reference Voltage for Analog Interfaces of BB's should allow signal processing within complex analog architectures.
DC Reference Voltage Current Sources should allow to control power consumption and impedance levels of BB's.
The description level of BB's can be at the following levels:
Mathematical Level
Behavioural Model usable in Standard Circuit Simulator
Circuit Model (Standard Circuit Simulator)
Layout Model, such including the added effects of parasitic circuit elements
Fast & Efficient Transition from Prototype to Mass Product associates to:
Circuit parameters, such as Vcc and dynamic range, and layout parameters, such as fixed analog parameters like values of Resistors and Capacitors during prototype design.
Digital (Bus) parameter during evaluation of prototype at set-maker' premises and final specification of the complete system
Fast Mass Product Specification associates to:
Fast transition from prototype, or the blueprint of the product, to a fully specified mass product with critical performance/price ratio will be based on:
Fast trade-off among performance, such as Signal-to-Noise-Ratio and THD, versus cost price, such as determined by chip area, current consumption or supply voltage.
The most important trade-offs will be available as mathematical models for each BB FIG. 2 illustrates a schematic of a single circuit item for use with the present invention. For brevity, the internal functionality 30 of the item on an input signal 36 for therewith producing an output signal 38 has not been detailed. The circuit item is programmable through elements 32 and 34, through respectively associated programmability interfaces 37, 39. The programmability may influence various analog or steppable parameters such as specified herebefore. In particular, the elements 32 and 34 may be programmable through hardware or software. The programmability may be on the level of resizing the circuit item, and may sometimes cause the moving of the circuit item through the overall circuit layout. Another aspect is to introduce discrete elements that amend the operation, such as through amending the number of elements of a multi-element facility, such as the number of steps of a resistor ladder, or the number of stages of a multi-stage filter to amend the filtering order which may influence the selectivity of the filter. For the latter, the adding or removing may be effected by having both a resistor bank and a capacitor bank. The amending may be done by activating or deactivating a particular interconnection, or by shortcutting a particular element, respectively, as according to the various cases delineated in the foregoing. Another method is to introduce mask programmability that may amend circuit properties until at a late stage in manufacturing. A still further possibility for amending is through having programmable hardware, such as through the loading of a control register.

Figure 3:
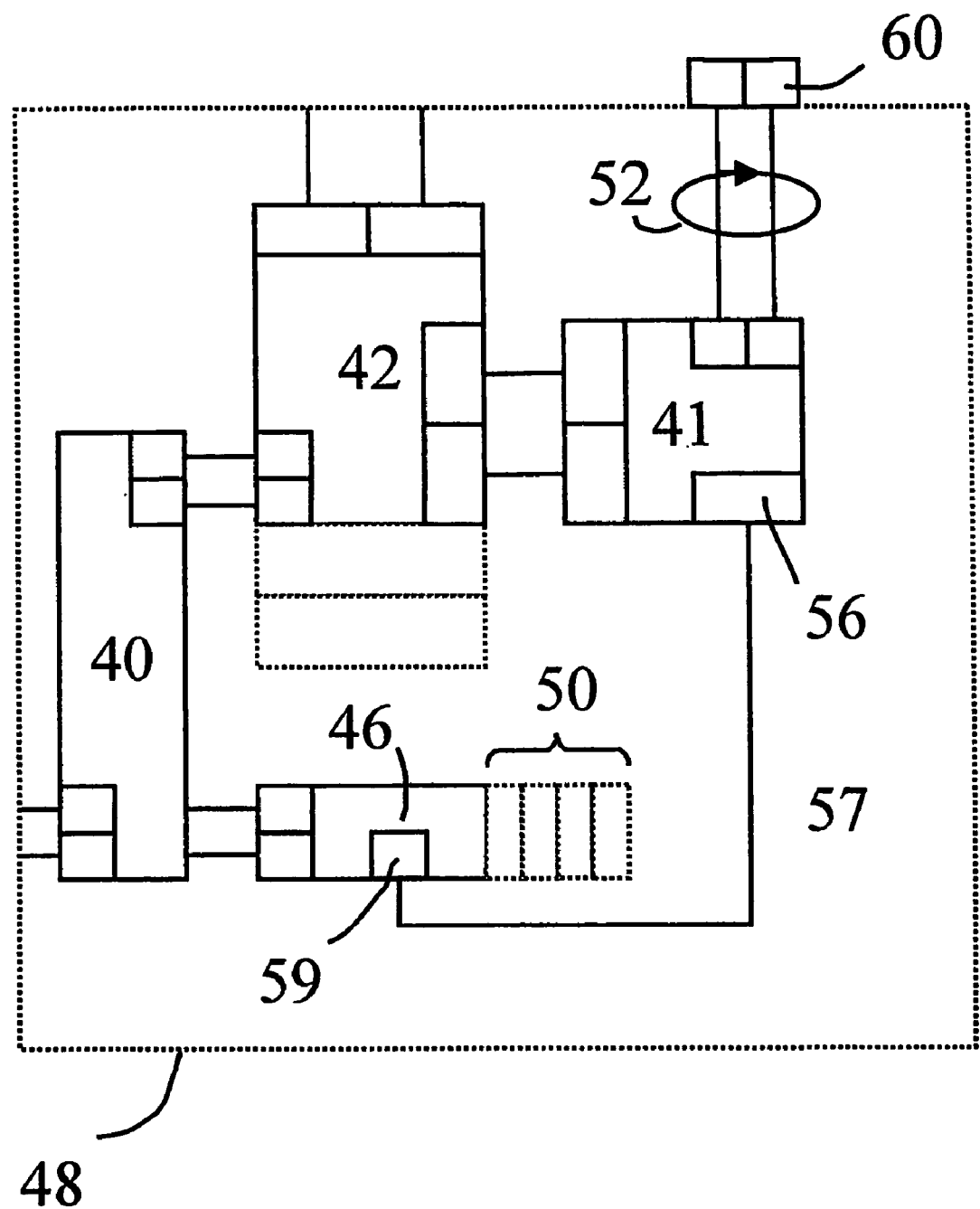
FIG. 3, a schematic of a design of the invention having a plurality of building blocks.

FIG. 3 illustrates an elementary schematic of a solid state circuit (48) design according to the present invention featuring a plurality of circuit items (40, 42, 44, 46). Circuit item 46 is extendible in four steps as indicated by label 50 so that a particular analog property thereof such as a capacitance value, may be varied accordingly. Similar extendibility has been indicated with respect to circuit items 42, 44. Circuit items 44 and 46 has been shown interconnected through lead 54 that terminates in interface elements 56, 58, respectively. Circuit item 44 interfaces to an external world through lead pair 52 that respectively terminate at bond pad pair 60. For brevity, the other elements depicted have not been labeled. Next to programming of the circuits through resizing as shown, also internal programmability through software may be provided, such as indicated in the preceding paragraph. The amending of the value of a particular circuit parameter, and the associated resizing of a layout block, may be followed by moving the entire block in a convenient direction. If, for example, the extension 50 of circuit block 46 were removed, the overall block could be moved to the right, thereby shortening lead 54 accordingly. This will however not influence the overall size of the layout immediately. Such will quite often not even be very useful, if the layout size is bondpad-limited, so that the circumference length should be kept fixed anyway.

In the design process, the amendable parameter value may be described by an appropriate mathematical model. The actual setting of a parameter value may be effected through an interface to an external or internal microprocessor item. The setting of a single operational parameter value such as a frequency, may be effected through collective amending of two or more circuit size parameters, such as a resistance and a capacitance combined. An advantageous aspect of the invention is that parameter values may be kept independent of the design of a building block. The model produced by implementing the invention may be used straightaway for mag. Another instant of use of the invention is to provide a simulation model of the intended circuit. The invention may be used for circuit design with a particular eye on higher level functions. In designing of a circuit, the sing point may be a mathematical model that has many parameters, which model allows to attain a technically optimum result. Thereafter, the design goes stepwise to a behavioural model that has fewer parameters, in that only part of the model is mathematical, whereas the remainder is circuitry already. Finally, the model steps down to a transistor level, wherein the number of amendable parameters is generally still lower. For realizing the invention, various building blocks are parametrizable. Furthermore, in the structure, the parameters are kept separately from each other. The design starts with the conceptual defining of building blocks for herewith attaining the necessary functionality. Subsequently, the functionality is mapped on a plurality of building blocks as required.

Actual usage of the design methodology of the present invention may be effectively detected from various aspects of the design process, or from the using of the design for generating a particular circuitry layout instance. In fact, the user interface towards the designer person will often exhibit various key aspects of the invention, such as through the showing of menus, block representations, operationality curves, and many others. As an elementary example, it would be possible to design and test a Phase Locked Loop and an Oscillator in many widely different ways. A first phase thereof could be to trade-off a dynamic range (Carrier-to-Noise Ratio CNR) versus circuit area and/or power dissipation. It would be feasible to do so with a xls (EXCEL) program module constituting a part of the silicon compiler of the present invention. Thereafter, the system can be tested in various ways. For the PLL, such may be done on the Behavioural Model BM) level, such as through capture range, lock-range, the oscillator frequency, and other parameters. This procedure will be followed from the Behavioural Model level down to the circuit level in a top-down design procedure. Thereafter, the test is started again on the BM level. All this would be very time consuming with prior art technology. Next, the layout proper would produce certain parasitc values, that would need to be included in the final test as well. Such approach that would combine the assessing of functional, economical (such as solid state area), multilevel (BM and circuit aspects in alternation) and layout aspects (such as parasite circuit elements), connectivity would represent an insurmountable problem for all prior art approaches.

Figure 4:
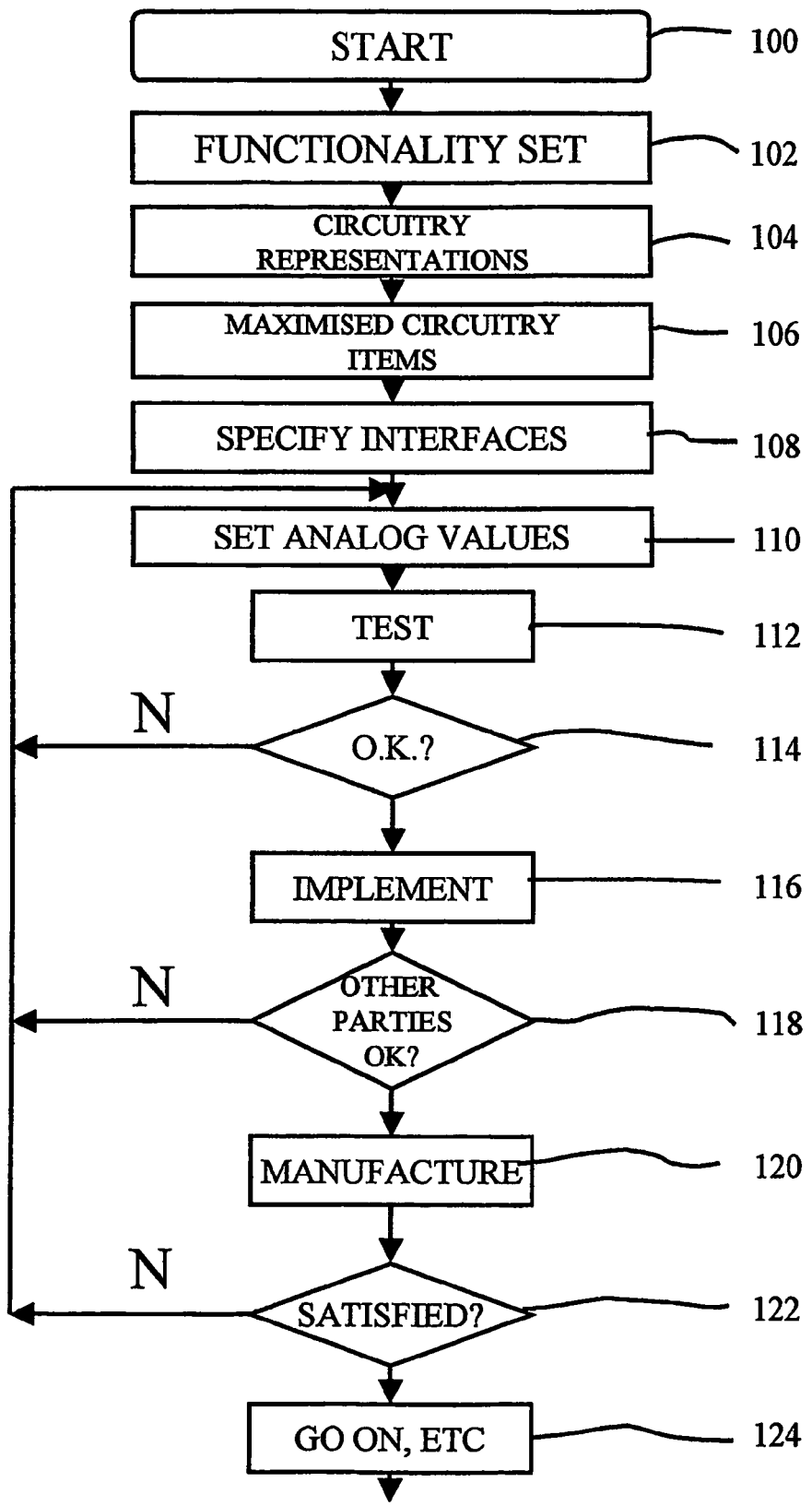
FIG. 4, a first flow-chart of the design process.

FIG. 4 illustrates a first flow-chart of the design process according to the present invention. The flow chart associates to a relatively lower level. In block 100, the designing process is initiated. If necessary, a sufficient amount of hardware and software facilities are assigned, such as being located on a server facility. In block 102, a set or assortment of functionality items is specified, such as amplifiers, filters of various types, phase locked loops and disccriminators, for therewith realizing the overall functionality of the circuitry to be designed. The circuitry may comprise analog as well as digital functionality, but the present invention centers on effecting the analog variable or steppable aspects of the above circuitry items in a favourable manner.

In block 104, the various items so specified are mapped on appropriate circuitry representations, that may be specifically provided by the designer, retrieved from a library facility, or decomposed into lower level items that collectively constitute a higher level item. Thereupon, these lower level representations will be mapped as well. In block 106, the various such representations are mapped on maximized circuit items. This may, as well as any of the various steps in the overall designing process, be effected through a dialog with the designer or developer person, in a manner that by itself is commonplace in VLSI designing. In particular, such dialog may ask for the analog parameter values that would translate to a minimum allowable layout size of the final solid state circuit element, considering the electrical specifications. In block 108, the interfaces, both between the various circuit items of block 106, and between the latter items and an outer world as far as relevant, are specified. This would translate to line bundle widths, termination impedance values, configuring of a multi-circuit-element tree, specifying bondpads, and various other mechanisms that by themselves have become standard in VLSC designing.

In block 110, the various analog or steppable values are set. This may be effected immediately, such as through specifying a resistor value, or indirectly, such as through specifying a oscillator circuit's frequency. In a case where the latter depends on both a capacitor and a resistor value, appropriate values for those two may have to be selected in a combined manner. Thereupon, the ultimate circuit now has a realization that allows the execution of a test. In block 112, such a test is executed, such as through simulation. In block 114 the test is evaluated in view of pre-specified target functionalities, such as current consumption, stability, and others. The evaluation may have a positive result or otherwise. In the latter case, the process is routed backwards to block 110 for further (re)-design or optimization. If positive however, the process goes to the next level in block 116, wherein a certain implementation level is effected. This implementation may be in one of various forms, such as in the form of a hardware prototype, or rather as a simulation that will be subjected to inclusion in a next higher level of circuitry. The latter will eventually be subjected to its own appropriate test, which maps on one or more similar blocks as shown in FIG. 4, but on another level. If the test results of the simulated prototype have become available, they are forwarded to the other parties such as setmaker or IC manufacturer, discussed supra (block 118), who will then express their agreement or otherwise. If negative (N), the process reverts to an earlier stage (110) for adjusting of appropriate analog or steppable values. If positive (Y), in block 120 a pilot run is executed, which is again checked for customer's or other parties' satisfaction. If negative (N), the analog values may be adjusted again. If positive (Y), the next stage of the industrial column is entered (124), for example, through implementing small scale selling in the market. In general, there are repetitive possibilities to step backwards in the process. Note that many of the tested aspects could regard properties that are more or less a matter of choice, instead of having a good/faulty quality. Generally, the executing of a plurality of the above cycles in sequence will produce convergence.

Figure 5:
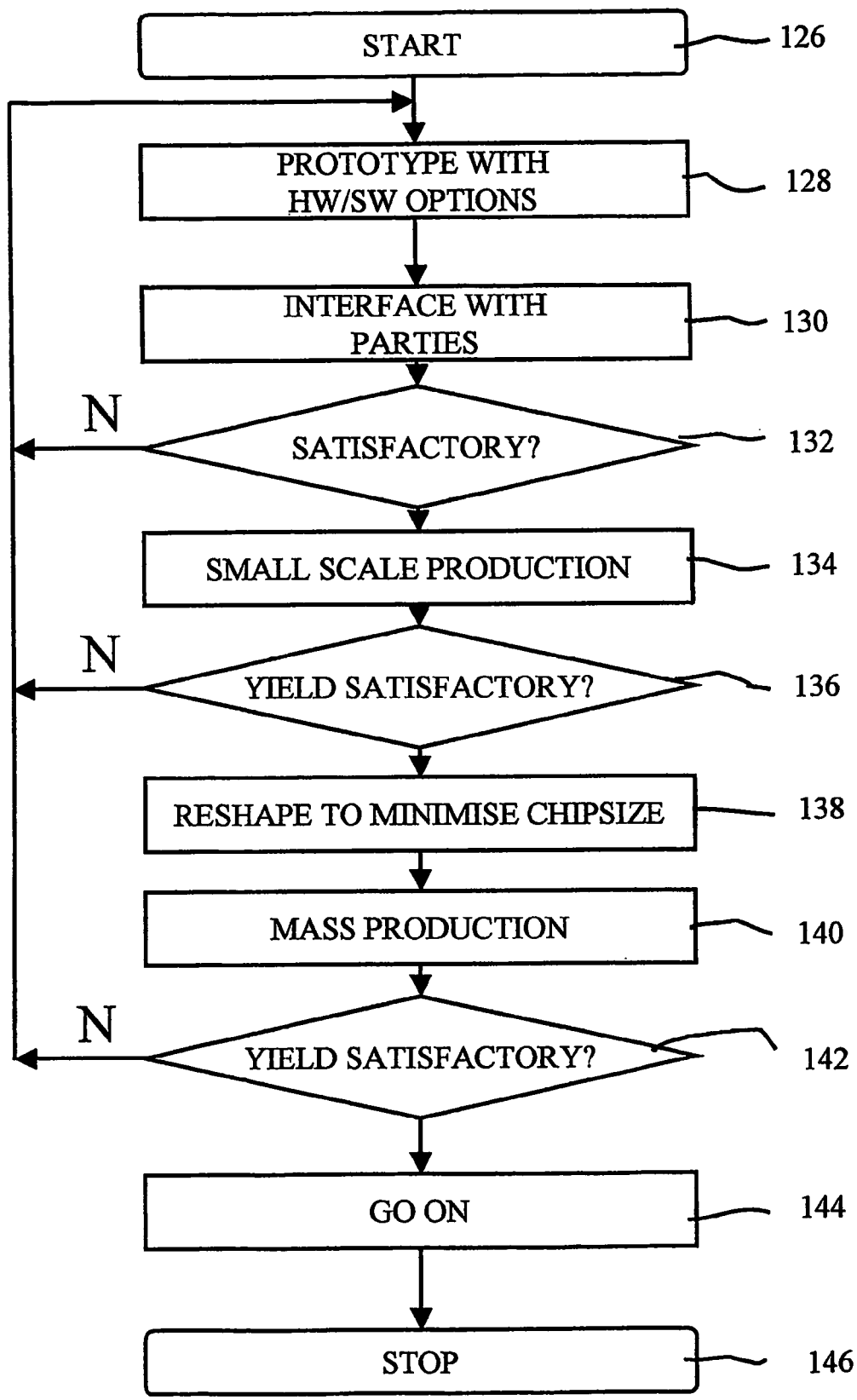
FIG. 5, a second flow-chart of the design process.

FIG. 5 illustrates a second flow-chart of the design process, on a somewhat higher level than does FIG. 4. The process starts in block 126. In block 128, a prototype with hardware- and software options is produced. In block 130 this is interfaced to the interested parties (FIG. 1). In block 132, the reactions are checked on satisfaction. If negative (N), the process reverts to block 128. If positive (Y), the process proceeds to small-scale production (134). In block 136, the manufacturing yield is checked. If unsatisfactory (N), the process reverts to block 134, such as through amending one or more manufacturing parameters, or if considered necessary, even to block 128. Generally, the shorter step back will be preferred over the longer one, if feasible. If satisfactory (Y), the design is reshaped to minimum chip size, while retaining the dimensions considered necessary for for being able to amend the circuit processing parameters. Next, in block 140, the circuit is manufactured in mass production. In block 142, the result is checked on its meeting of yield targets. If unsatisfactory (N), the process reverts to block 138, or, if considered necessary, to block 134, as considered supra. In rare cases, the reversion will extend as far back as to block 128. If the check is satisfactory however, the process proceeds to block 144, for continuing manufacture. In block 146, the designing process is considered terminated. Also here, eventually a convergence will result.

Figure 6:
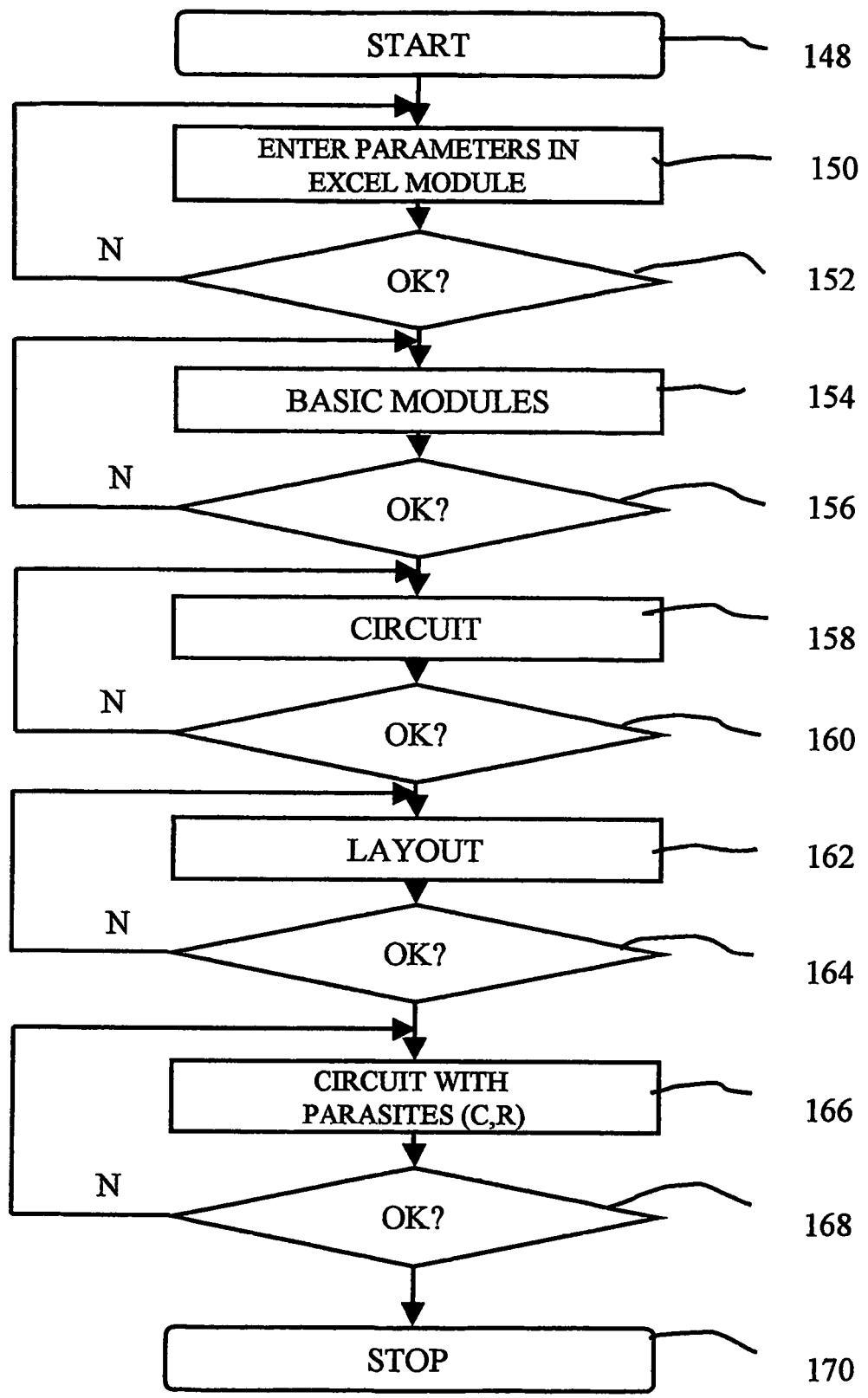
FIG. 6, a third flow-chart of the design process.

FIG. 6 illustrates a third flow-chart of the design process, with particular attention to the designing proper, i.e., up to block 128 in FIG. 5. In block 148, the process is started. In block 150, a circuit model is specified in an EXCEL module, expressing the relations of key parameters thereof such as the most important signal processing parameters vs cost price based on chip area and bonding pads by mathematical expressions. In block 152, the model is checked for correct functionality. If unsatisfactory (N), the process reverts to block 150, for amending the circuit representation in question. If satisfactory however (Y), the system proceeds to block 154, wherein the circuit is decomposed into basic modules, such as have been considered hereinbefore, and checked for correct mappability. If unsatisfactory (N), the process reverts to block 154, for amending the circuit representation in question, such as by further decomposing of a building block, or by designing a new building block that had yet been absent from an appropriate library therof.

If satisfactory however (Y), the system proceeds to block 158, wherein the overall circuit is composed from the basic modules, and checked in block 160 once more on correct functioning, such as by simulation. If unsatisfactory (N), the system reverts to block 158, wherein the circuit is amended, such as by setting a particular parameter to a new value. If satisfactory however (Y), the system proceeds to block 162, wherein the circuit is translated into a layout, that in general will not be optimized for compactness, in that the relative positions of the various circuit elements have not been optimized, and will furthermore allow for setting of parameter values as different from their provisional assignments. Then, in block 164, the layout is checked for correctly operating. If unsatisfactory (N), the system reverts to block 162 for amending the layout. If satisfactory however, the system proceeds to block 166, wherein the layout is translated to include parasitic circuit components such as resistances and capacitances, and checked for correct operation along the lines discussed earlier. If unsatisfactory (N), the system reverts to block 166 for amending, such as for amending the parasite per se. Often, the system will even revert to block 162, or even (not shown) to a still earlier block in the column, for amending the layout, or even the circuit mapping to attempt in getting a better circuit performance. If satisfactory however (Y), the system proceeds to output termination 170, and goes into the further process such as discussed with reference to FIG. 5.

Figure 7:
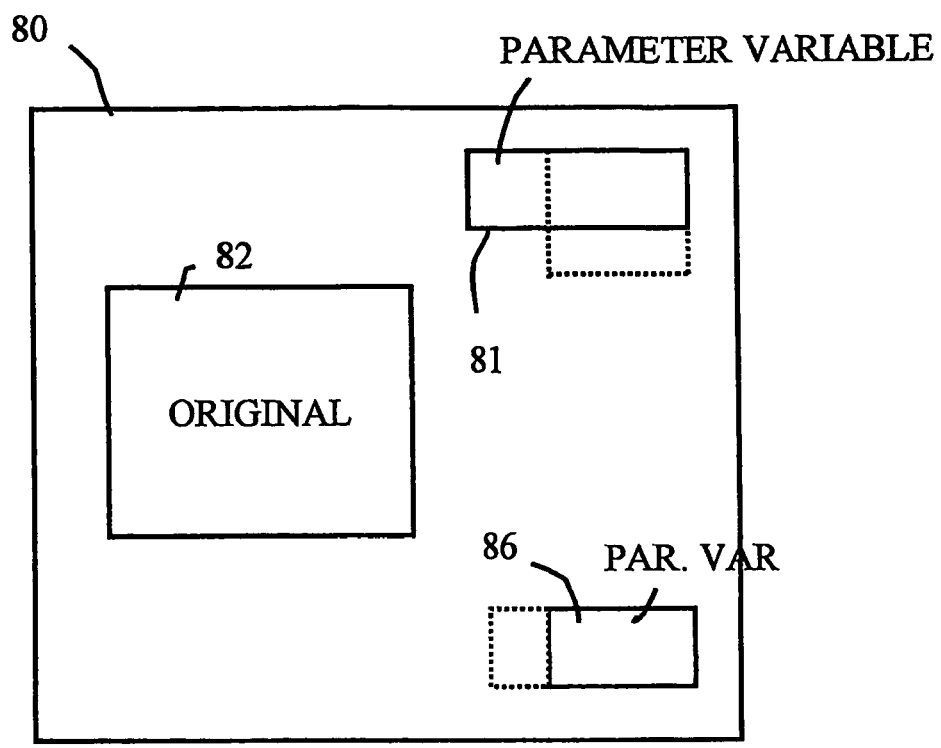
FIG. 7, a conceptual image of the reuse of building blocks.
Figure 7:
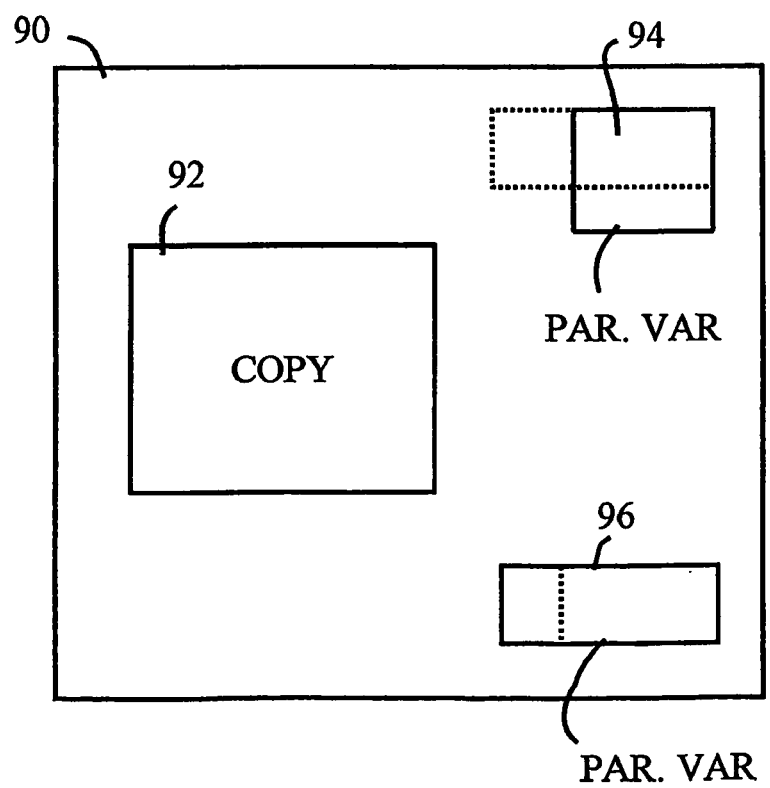

FIG. 7 illustrates a conceptual image of the reuse of building blocks. Block 80 represents a first building block with original function 82, and including two parameter variables associated to blocks 84, 86, respectively, as determined by the area drawn in solid lines. Furthermore, block 90 represents the reuse of the above building block 80, however, with different values of the above two parameter variables. This reuse translates into an exact replica of block 82 onto a copy block 92, and accompanied by parameter value blocks 94, 96, drawn in solid lines. The latter respectively associate to blocks 84, 86. As shown, block 94 is relatively shorter than block 84 in the horizontal direction, but relatively higher in the vertical direction. On the other hand, block 96 is relatively longer than block 86 in the horizontal direction, and equal thereto in the vertical direction. For reason of better comparison, the actual instance of the variable blocks has been drawn in a solid line, whereas the "other" variable block has been superposed thereon in the form of an interrupted line. In practice, the programmability range of this hardware programming can be appreciable, such as various orders of magnitude. One instance is, for example, that a value is more or less proportional to the area covered, such as in the case of a capacitor. The relationship may be more complex, such as for a resistor, where the parameter value may be proportional to the length, and inversely proportional to the width. The relation may be stepped, such as where adding of a stage to a filter bank will increase the filter order by one.

Figure 8:
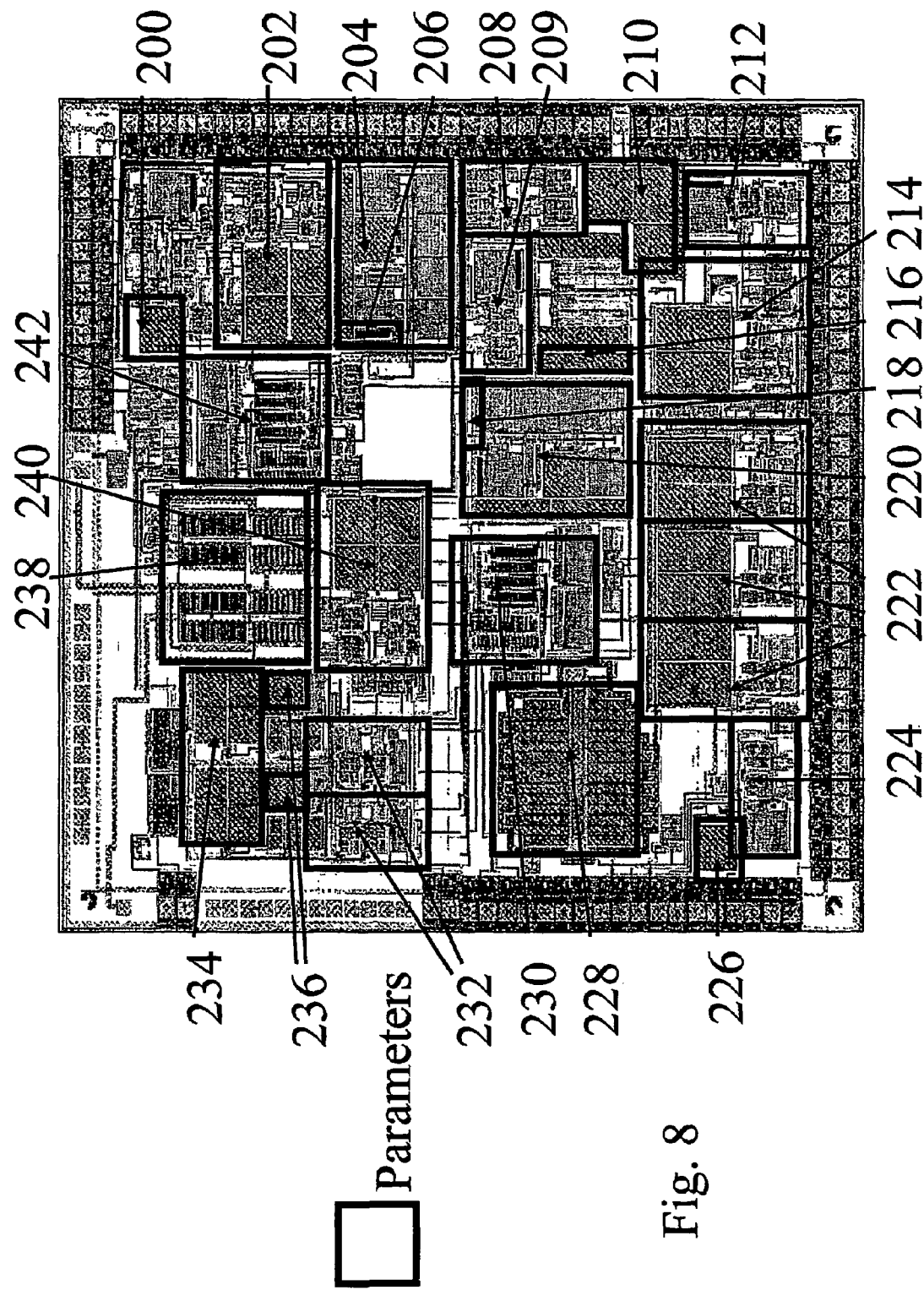
FIG. 8, a circuit layout generated according to the method of the present invention.

FIG. 8 illustrates a circuit layout generated according to the method of the present invention. The overall circuit represents an complete singe-hip audio tuner/pre-amplifier system for use with both AM and FM modulation. In the overall circuit, various building blocks have been delineated and highlighted. Furthermore, the four-edge-bondpad organization has been clearly shown. Also, numerous empty spaces are visible that could have allowed to physically extend an area allocated to an implementation of a particular variable, or which space has not been used, to prevent inflexibility associated to over-close packing. Evidently, the overall packing is far from being close.

The various categories of building blocks, insofar as shown, are the following. Item 202 is a resonance amplifier oscillator with variable item 200 that determines the actual integration time thereof. Item 204 is a phase locked loop with item 206 determining the current flow therein. Blocks 208, 209, 212 are three Automatic Gain Control elements with blocks 210 (regarding 208, 212), and 216 (regarding 209) containing the respectively associated variable values for determining the integration time constants thereof Item 214 is a resonance amplifier oscillator. Item 220 is again a phase locked loop with an associated current parameter value item 218. Blocks 222 are three resonance amplifiers. Item 224 is an automatic gain control with a variable determining item 226 for the time constant of the integration. Block 228 is a digitally controlled varicap and block 230 a digital interface that will be discussed more in detail with reference to FIG. 9. The relevant operational frequency of this subsystem is in the MHz region. Likewise, block 238 is a digitally controlled varicap and block 240 a digital interface. The relevant operational frequency of this further subsystem is in the 100 MHz region. Items 232 are againg two automatic gain control blocks, with in blocks 236 the respectively associated time constant determining variable values. Block 234 is a low pass filter containing the associated threshold determining variable value. Block 242 is is a resonance amplifier oscillator like block 214. Generally, the layout shows a clear distinction between irregular or "wild" logic, and regular structures such as those that define a resistor or a capacitance.

In the above, the resonance amplifier and resonance amplifier oscillators have reusable blocks as discussed with reference to FIG. 7, supra, which may be executed for example with hardwired resistance and capacitance parameter values. On the other hand, the combination of a digital interface and a digitally controlled varicap, also in FIG. 8, effectively constitute a capacitance with a value that may be set according to the present invention. The two sub-blocks in question interface to each other on plural bit lines, of which the exact number controls the capacitance. value. In fact, this number is software programmable for setting the associated parameter value. It should be understood from the foregoing that a resonance amplifier may have its frequency chosen in two different manners: either on the basis of the hardware extension or size of one or more particular circuit elements, or, otherwise, as based on software digital programming of a digital number that governs the actual operativity of the circuit element in question. Depending on the instant when the value should be amended, and on various other aspects or circumstances, one or the other of the two qualitatively filly distinct approaches method would present the most preferable solution. The programmability can be inherent in the definitions of the various building blocks.

In general, the building blocks generally have repetitive structures for facilitating a straight-forward design. Now, the particular setup of the circuit of FIG. 8 for realizing the functionality as indicated supra may be realized by persons skilled in the art in a straightforward manner, as constituted from the various building blocks delineated supra. Furthermore, given the layout according to the Figure, that in fact has plenty of detail on a much smaller scale than can be shown in this overall image, the translating to an actual hardware realization is straightforward to a person skilled in the art of semiconductor processing.

Now, the above discussion of various building blocks has given variables assigned to these respective building blocks. Furthermore, it should be clear from the layout that various blocks have further repetitive inside structures. Certain ones thereof may be fixed to the building block in question. In other situations, a particular building block may contain a subaltern or hierarchically lower building block that itself contains one or more variables assigned thereto and with associated parameter value(s) settable in the same manner as discussed for the higher level variables hereinbefore. For brevity however, a fuller discussion thereof has been left out.

Figure 9:
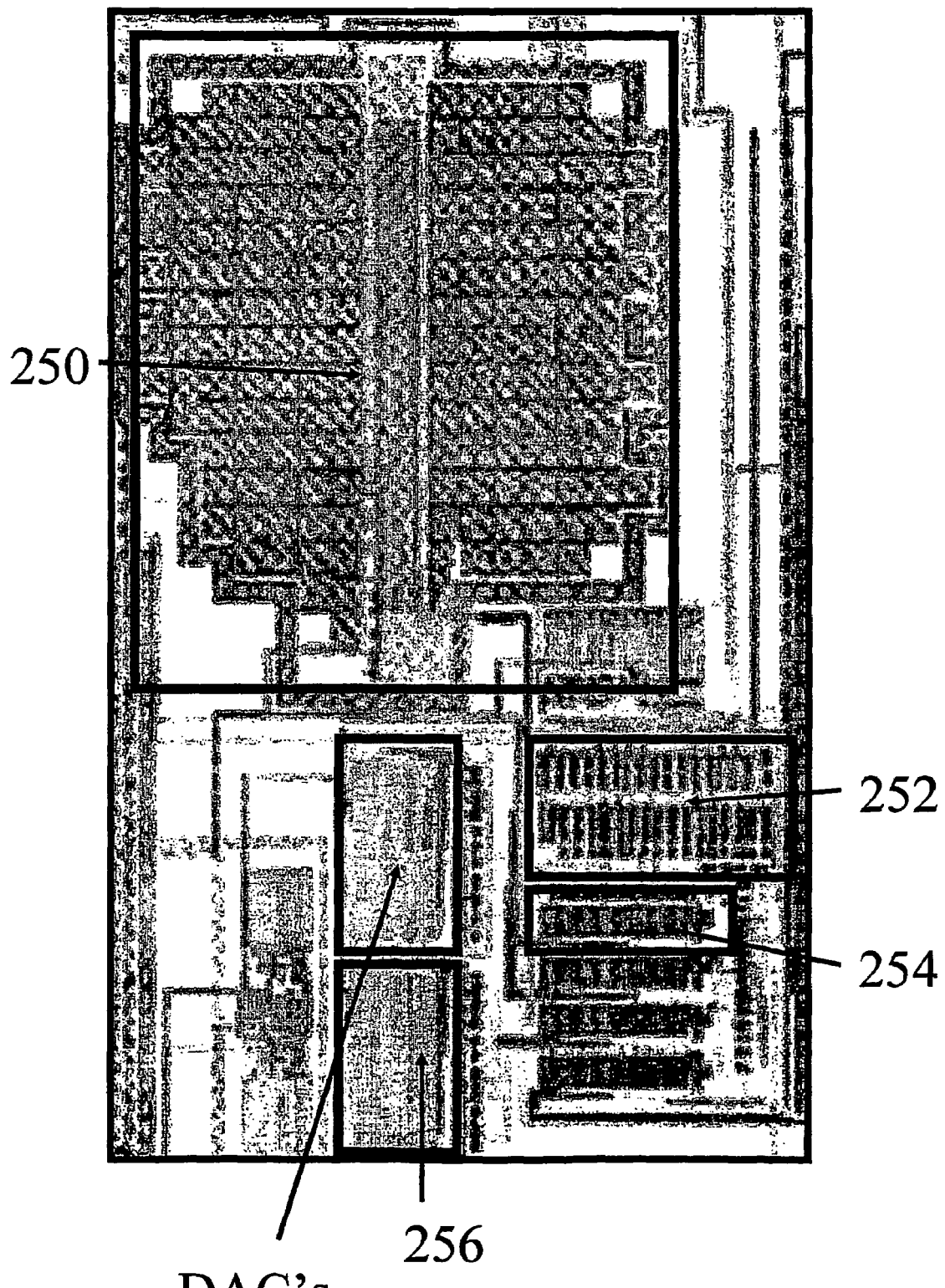
FIG. 9, an enlarged image of a part of FIG. 8.

FIG. 9 illustrates an enlarged image of a part of FIG. 8, and in particular, the combination of a digitally controlled interface and a digitally controlled varicap. The Figure effectively blows up items 228 and 230 in FIG. 8. Item 250 at left represents an 11 bit capacitor bank, that in consequence will have a spread from 1 to $2^{11}$. Item 252 is a serial to parallel converter, of which the 11 parallel bits control the capacitor bank that interfaces to the remainder of the circuit. Likewise, item 254 is a register bank for storing the 11 control bits for the capacitor bank control. Finally, item 256 represents two Digital-to-Analog Convertors DAC. Taken as a whole, the circuit operates as a programmable capacitor.

Figure 10:
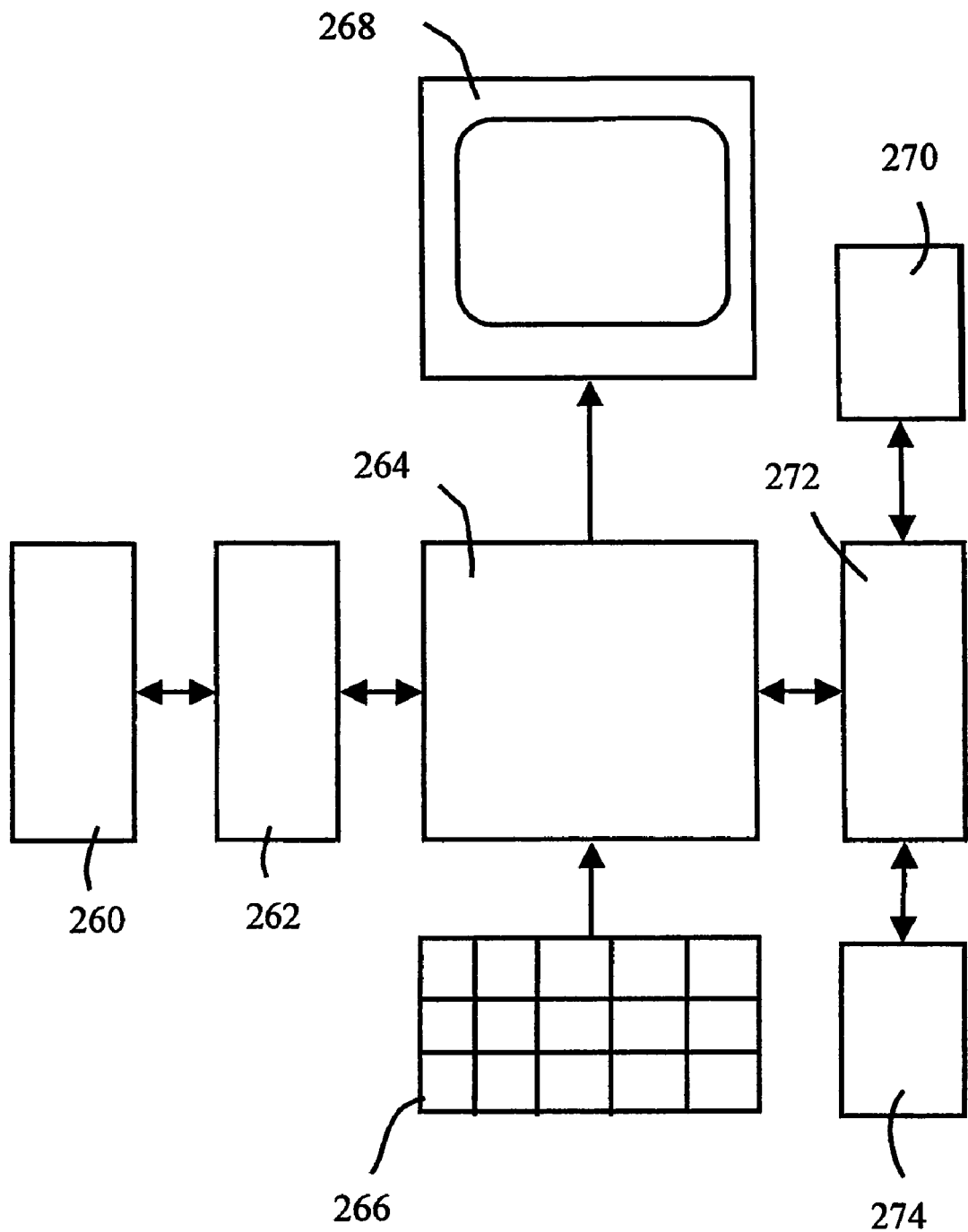
FIG. 10, a conceptual arrangement of an apparatus for generating a layout as shown in FIG. 8.

FIG. 10 illustrates a conceptual arrangement of an apparatus for generating a layout as shown in FIGS. 8, 9. At left, the generating of the conceptual aspects of the circuit are symbolized. Memories 260, 262 store mathematical expressions and their translation to circuit representations, respectively, so that the selecting thereof on user interface 266 will produce circuit representations on a rather abstract basis on user output device 268 that may contain a printer and the like next to the visual display shown. On the other side, memory 270 contains scalable layouts of various circuit elements and parasitic accessories to such such circuit elements, and memory 274 contains simulation programs for checking on the actual behaviour of a conceived circuit or subcircuit item. Processor 272 will run the simulation of the circuit realized in layout either with or without the parasites discussed earlier and check the operation for compliance with user-entered requirements on interface 266 that may contain other elements than the keyboard shown symbolically. Central processor 264 controls the user interface and the various other subsystems, and allows to construct the circuit representations (item 104 in FIG. 4).

FIG. 11 illustrates the global structure of a progammable building block on an abstract level. The left hand column lists the various parts of such building block, the right hand column lists the respectively associated important aspects of those parts. Now first, there is the "active circuit" or "core" of the building block in question. This core defines the overall functionality and the limits to this functionality, especially in terms of RF performance and noise. Changing of the manufacturing technology could cause great changes in those performance limits, such as the changing from MOS to bipolar or vice versa This first stage generally will require much design effort. Next, at left there are passive parameters (R, C, L) that will be fixed in the ultimate design. Inasmuch as realizing these parameters may require various on chip elements, they may under certain circumstances require relatively much chip area. These parameters are programmable only in the layout, and will generally be little sensitive to changes of the technology. However, the selection of the analog or steppable values must be done relatively early in the design process. Finally, at left there are passive programmable parameters. Also here the largest size for effecting the parameter value must be available on the chip, but the parameters are programmable via a BUS or another transfer mechanism that communicates control information. This procedure will allow to delay the fixating operation until a very late stage of the manufacturing process. The effecting of the parameter values is an important determinant of the circuit's price.

FIG. 12 illustrates the global structure of ASiC with three highly interacting levels. The top level is the relational level, of which characteristic aspects are a library of relations between performance in various aspects, and cost price. Moreover, there are rules for generating new relations. These rules determine the interaction with the building block level to be discussed next. On a first level of interaction, the rules may be expressed by explicit qualitative or quantitative relations. Another possibility for expressing these rules is through generating various instances or quantitative examples of the circuit. The determination of the ultimate performance and price data may then be done by interpolation, extrapolation, or by nomography-like techniques that by themselves have been in widespread use in various branches of technology. For brevity, no further discussion thereon is given here.

The performance and cost price are used on the right of the Figure to get support in Vendor-Buyer relations, to position an emerging product, and in later stages, to optimize a mature product. The latter may be done in various ways. A first one is eliminate invisible performance of the circuit. For example, in a chain of circuit functions, the overall performance is often determined by a "weaker" function. Such situation will often be the result when using preexisting designs for those "stronger" circuit functions. Repositioning of those other circuit functions to lower performance, such as a lower S/N ratio, may then lead to a lower overall price, but unchanged performance. Another type of optimization is the improving of certain circuit functions, such as the lowering of power consumption, or the effective diminishing of noise.

The next lower Circuit level of the Figure concerns the building blocks (BB). At left, characteristic aspects thereof are a library of BB circuits, and furthermore rules for defining new BB's . At right, the application of these building blocks is to support the generating of programmable designs, and furthermore, providing the sheer possibility to attain first-time-right designs. The interactions with the next lower level in the Figure have been indicated at left, inasmuch as these interactions imply parasitic elements, and the various active circuit elements and associated parameters.

The lowest level in the Figure is the layout level. At left, characteristic aspects are a library of programmable layouts of Building Blocks, and rules for the defining of new programmable layouts. The application thereof at the right is to support flexible layout with respect to the encapsulation of the final circuit, and to ensure a sufficient degree of testability.

Through applying the present invention, it has been found possible to use or reuse programmable circuit elements in designing various electronic analog circuit designs that are first-time-right. It has also been found possible to execute redesigns and/or design changes in an extremely fast and transparent maimer, whilst always being able to quasi-instantaneously present both operating parameters and price, either through analytic-relationship tools, or through a nomographic-like approach.

Now the invention has been fully described with reference to the preferred embodiments. However, persons skilled in the art will recognize various changes and amendments thereto. As long as these would not depart from the scope of the invention as claimed in the accompanying Claims, they should in consequence being construed as forming part of the invention.

The invention claimed is:

1. A method for generating a Solid State Integrated Circuit Layout comprising:
   specifying an intended plurality of functions,
   translating the plurality of functions into a plurality of circuitry representations,
   converting the circuitry representations into circuit items of an overall circuit,
   configuring first interfaces among a plurality of circuit items within the overall circuit, and second interfaces between one or more of the circuit items and an external interface in accordance with predetermined interface specifications,
   wherein
   for a situation wherein various such circuit items represent respective analog and/or steppable values of a parameter to be specified on the basis of a circuit item in question:
      assigning a parameter to a single such circuit item to be realized as a building block, and
      assigning the building block a sufficient amount of in-design resizability space in accordance with a prespecified redefinability value range for the parameter.

2. A method as claimed in claim 1, wherein the design is effected in a plurality of cycles, and wherein convergence is attained through in successive such cycles amending a size of one or more particular circuit items within a respectively assigned in-design space for so attaining the desired plurality of functions.

3. A method as claimed in claim 1, wherein the building block includes a hardware and/or software programmability interface with respect to an applicable value range for the parameter.

4. A method as claimed in claim 1, wherein at least one such building block has assigned thereto at least two parameter values.

5. A method as claimed in claim 1, wherein at least two such parameter values are programmable in respectively associated building blocks that with respect to each other are configured into a hierarchical structure.

6. A method as claimed in claim 1, wherein a particular building block that represents a combination of a functionality circuit item and one or more parameters is reused in such design in two or more versions as being associated to respective such circuit item instances and, as the case may be, to respectively different parameter values.

7. A Solid State Integrated Circuit design, having been implemented through using a method as claimed in claim 1.

8. An integrated circuit design as claimed in claim 7, provided with a circuit item which as a building block is programmable in at least two qualitatively different ways to combine faster design with flexibility.

9. An integrated circuit design as claimed in claim 7, provided with software programmability of the building blocks for use in one or more of the following aspects: to increase manufacturing yield, to integrate alignment points, and to adapt the functionality to a requirement of an end user.

10. An integrated circuit having been designed through using a method as claimed in claim 1.

11. An integrated circuit as claimed in claim 10, and having analog and/or digital programming facilities for programming the parameter after manufacturing.

12. An apparatus for generating a Solid State Integrated Circuit Layout comprising:
   a receiver that is configured to receive an intended plurality of specified functions,
   a translator that is configured to translate the plurality of specified functions into a plurality of circuitry representations,
   a converter that is configured to convert the plurality of circuitry representations into circuit items of an overall circuit, and
   a configuring element that is configured to configure first interfaces between interacting circuit items within the overall circuit and second interfaces between further such circuit items and an external interface in accordance with predetermined interface specifications,
   an assignor that is configured to, in a situation wherein various such circuit items represent respective analog and/or steppable values of a parameter to be specified on the basis of a circuit item:
      assign a parameter to a single such circuit item to be realized as a building block, and
      assign a sufficient amount of in-design resizability space to the building block in accordance with a prespecified redefinability value range for the parameter.

13. An apparatus as claimed in claim 12, wherein the assignor assigns a hardware and/or software programmability interface with respect to an applicable value range for the parameter being assigned to the building block.

14. An integrated circuit design as claimed in claim 13, provided with hardware programmability of the building blocks for use to meet one or more fundamental analog signal processing requirements.

15. A method for generating a Solid State Integrated Circuit Layout comprising:
   specifying an intended plurality of functions,
   translating the plurality of functions into various circuitry representations,
   converting the circuitry representations into circuit items of an overall circuit,
   configuring first interfaces between interacting circuit items within the overall circuit and second interfaces between further such circuit items and an external interface in accordance with predetermined interface specifications, and generating the integrated circuit layout in a top-down design flow, wherein the following design levels are executed:
a. specifying an overall circuit functionality and key parameter trade-offs,
b. detailing the overall circuit functionality into multiple library layout building blocks, wherein one or more of the library blocks includes a sufficient amount of in-design resizability space in accordance with a prespecified redefinability value range for reprogrammable parameter values.
c. (re)-assigning to the one or more library blocks various reprogrammable parameter values.
d. testing the overall circuit to provide a first tested performance,
e. returning to step c, if the first tested performance does not satisfy a target performance,
f. introducing parasitic values associated to the overall circuit as specified,
g. testing the overall circuit with the parasitic values to provide a second tested performance.
h. returning to step c, if the second tested performance does not satisfy the target performance.

16. A method as claimed in claim 15, wherein the specifying is effected in an EXCEL program module.

17. A method as claimed in claim 15, wherein at least one building block has a software programmable multi-value range for an associated further parameter value.

* * * * *